United States Patent [19]
Hirono et al.
[11] 3,731,182
[45] May 1, 1973

[54] PHASE CONTROL TYPE DIMMING SYSTEM WITH MEANS TO COMPENSATE FOR THE HYSTERESIS EFFECT

[75] Inventors: Akira Hirono; Masayoshi Miyajima, both of Kyoto, Japan

[73] Assignee: Blackwell Electronics Ind. Co., Ltd., Kyota, Japan

[22] Filed: Nov. 3, 1971

[21] Appl. No.: 195,408

[30] Foreign Application Priority Data

Sept. 6, 1971 Japan ....................46/68759
Sept. 6, 1971 Japan ....................46/68760
Sept. 6, 1971 Japan ....................46/68761

[52] U.S. Cl. ..........323/19, 307/252 B, 307/252 N, 315/196, 315/307, 323/24, 323/36
[51] Int. Cl. ..........G05f 3/04
[58] Field of Search ..........307/252 A, 252 B, 307/252 N, 303, 305, 324; 315/196, 251, 307; 323/16, 19, 22 SC, 24, 34, 35, 36, 39

[56] References Cited

UNITED STATES PATENTS 3,447,067 5/1969 Spofford, Jr. ....................323/36 X
3,619,656 11/1971 Domke ....................323/24 X
3,526,003 8/1970 Granieri ....................307/305 X

*Primary Examiner*—A. D. Pellinen
*Attorney*—Raphael Semmes

[57] ABSTRACT

A phase control type dimming circuit employs a TRIAC in series with a load and an A.C. power source and a trigger circuit including a variable resistor and condenser in series across the TRIAC with a SBS connecting the junction between the resistor and condenser and the gate electrode of the TRIAC. A compensation circuit, which is connected to the gate terminal of the SBS to eliminate the hysteresis effect and extend the control range, includes in one embodiment a resistor and diode in series, in a second embodiment a pair of resistors in series and a pair of diodes connecting the junction point between the resistors to the anodes of the SBS, and in a third embodiment a resistor and a first diode in series and a pair of additional diodes connecting the junction between the resistor and the first diode to the anodes of the SBS. The third embodiment may be provided as a monolithic integrated circuit including the three diodes incorporated within the SBS.

4 Claims, 8 Drawing Figures

INVENTORS
AKIRA HIRONO
MASAYOSHI MIYAJIMA

Raphael Semmes
ATTORNEY

INVENTORS
AKIRA HIRONO
MASAYOSHI MIYAJIMA

Raphael Semmes
ATTORNEY

*INVENTORS*
AKIRA HIRONO
MASAYOSHI MIYAJIMA
Raphael Semmes
*ATTORNEY*

PHASE CONTROL TYPE DIMMING SYSTEM WITH MEANS TO COMPENSATE FOR THE HYSTERESIS EFFECT

BACKGROUND OF THE INVENTION

This invention relates to improvements in a phase control type dimming system employing a bidirectional three terminal thyristor (which will be referred to as TRIAC hereinafter). More particularly, the invention is concerned with circuits of this character in which the TRIAC is connected in series with an A.C. power source and a load and in parallel with a variable phase control resistor and timing condenser, the junction between which is connected by a breakdown device, such as a silicon bilateral switch (which will hereinafter be referred to as SBS) to the gate electrode of the TRIAC. Circuits of this type are subject to a considerable hysteresis effect in the lower output region at the beginning of conduction and are controllable over a limited range of voltages.

SUMMARY OF THE INVENTION

It is accordingly the principal object of the invention to provide an improved phase control type power control or dimmer system which overcomes the aforementioned drawbacks.

A more specific object of the present invention is to provide a basic dimming circuit which incorporates a compensating circuit, the dimming circuit thereby permitting control over a wide range of voltages while eliminating the considerable hysteresis effect in the lower output region which takes place when the circuit begins to become conductive.

It is a related object to provide a system of this character in which the compensating circuit serves to reset the accumulated charge on the timing capacitor substantially to zero at the onset of one or both half cycles of the power wave.

An additional object of the invention involves providing an improved dimmer circuit of this character which may be compactly constructed at relatively low cost.

A further object of the present invention is to provide a compact and economical dimming circuit by providing the circuit as an integrated circuit in which diodes included in the compensating circuit are incorporated as one semiconductor with the SBS.

Briefly, this invention provides a phase control type dimming system having a combination of a dimming circuit with a compensating circuit incorporating resistors and diodes. The dimming circuit consists of (i) a main electric current control circuit completed by connecting in series relation a power source, a load and a TRIAC and (ii) a gate trigger circuit in which a variable resistor and condenser are connected in series relation with each other and arranged in parallel relation with the main electric control circuit with an intermediate point between the variable resistor and the condensor being connected via a SBS to the gate of the TRIAC. According to the present invention, a compensating circuit is connected to the gate electrode of the SBS to eliminate the hysteresis effect and to extend the voltage control range. In one embodiment, the compensating circuit comprises a resistor and diode in series between one side of the TRIAC and the gate electrode of the SBS. In a second embodiment, a pair of resistors are so connected with a pair of diodes respectively connecting the junction between the resistors to the anodes of the SBS. In a third embodiment, a resistor and a first diode are connected in series to the gate electrode of the SBS with a pair of additional diodes connected respectively from the junction between the resistor and the first diode to the anodes of the SBS. The third embodiment may be provided as a monolithic integrated circuit in which the three diodes and the SBS are incorporated in a single semiconductor. Each of the embodiments operate to reset the charge accumulated on the timing condenser to zero at the onset of one or both half cycles of the power wave.

These and other objects, features and advantages of the present invention will be described in greater detail hereinafter with reference to the accompanying drawings.

DETAILED DESCRIPTION

Figures 1, 2, 3:
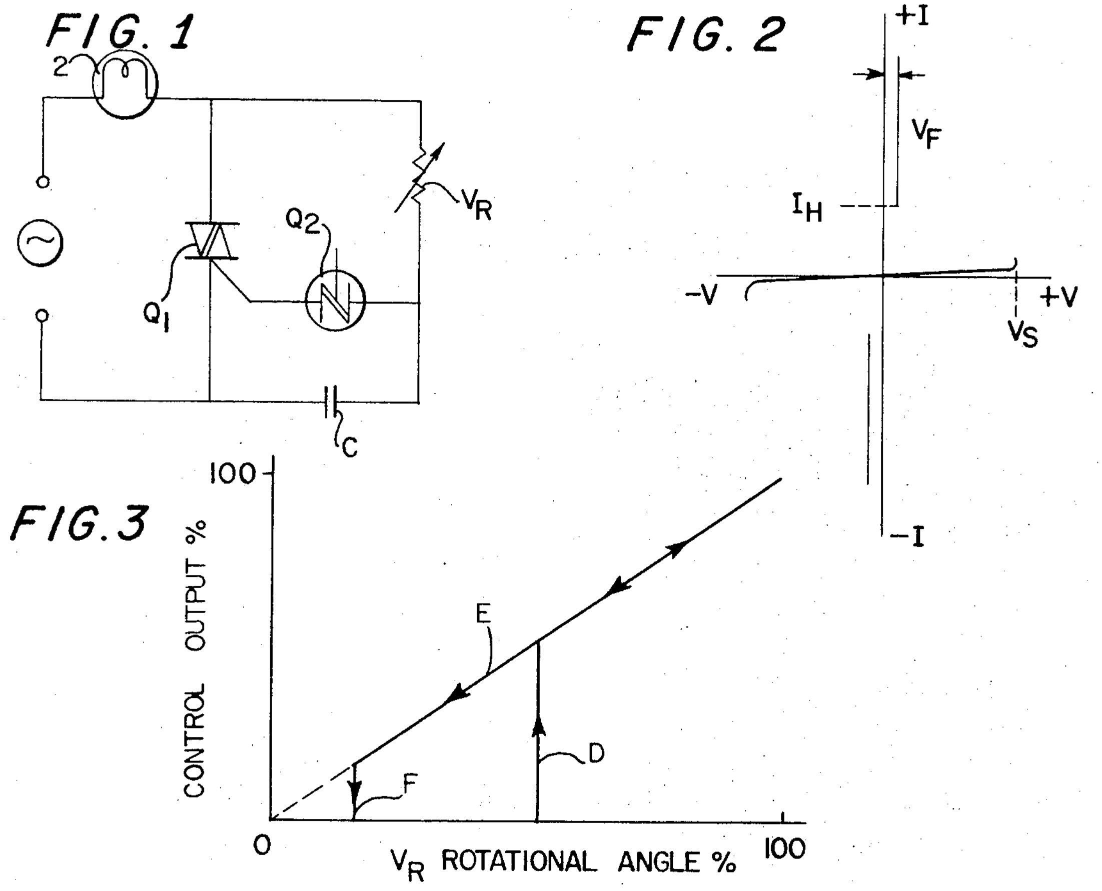
FIG. 1 is a circuit diagram of a basic phase control type dimming system.
FIG. 2 is a static characteristic diagram of a silicon bilateral switch (SBS)
FIG. 3 is a characteristic diagram with respect to the hysteresis effect and the control range of said basic circuit.
Figure 4:
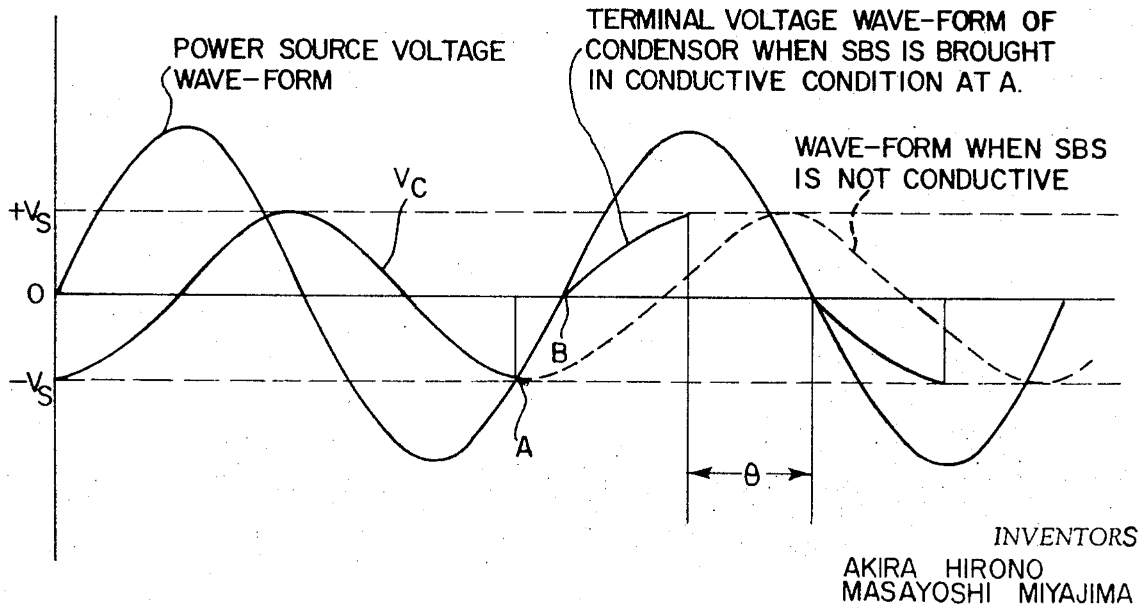
FIG. 4 is a diagram illustrating the hysteresis effect.

Referring now to FIG. 1 in which is shown a basic embodiment of a phase control type dimming system, there is provided a phase control circuit which is formed with a variable resistor Vr and a condenser C in such a manner that when the voltage at the opposite ends of the condenser C reaches the switching voltage Vs of SBS Q2 (see FIG. 2), the electrical charge accumulated in condenser C will trigger TRIAC Q1 so as to cause the latter to be conductive. Phase control is accomplished by varying the variable resistor Vr so as to make TRIAC Q1 conductive at an arbitrary angle, since the voltages and phases at the opposite ends of condenser C will vary with the variation in the resistor Vr. However, this basic circuit suffers from the disadvantages that the control range is limited and a considerable hysteresis effect, as shown in FIG. 3, takes place in the lower output region when said circuit begins to become conductive. The reasons for this are shown in FIG. 4. As the resistance of the variable resistor Vr is gradually decreased from the maximum, the voltages at the opposite ends of condenser C will increase until the peak value thereof reaches the switching voltage Vs of SBS Q2. When SBS Q2 becomes conductive at a point A, thereby developing a trigger pulse, the condenser will discharge the electrical charge therefrom, thereby reducing the terminal voltage almost to zero, with the result that the conduction phase in the subsequent half cycle will have a phase difference of $\theta$. Therefore, once triggered, triggering will continue to be effected, even though the resistance at the variable resistor Vr becomes greater than in the initial conductive condition, and thereby the control can be carried out down to a further lower output voltage; but the minimum control voltage is still too high for practical applications. Before conduction is effected, the voltage Vc across condenser C lags the power wave in phase with a residual charge of one polarity being present at the onset of a power wave half cycle of opposite polarity. As a result, a longer time is required to reach the switching voltage Vs of the SBS. Once switching voltage Vs is reached, however, the condenser is discharged at time A; and on the next half cycle, the condenser is charged from almost zero and thus reaches switching voltage Vs more quickly. Thus, referring to FIG. 3, at the beginning of conduction a relatively large rotational angle of Vr is required as shown by leg D of the characteristic with a relatively large control output percentage. After conduction in initiated, the rotational angle may be reduced along leg E to a minimum position F at which the output will fall to zero, position F thus defining the lower end of the smooth control range. The loop D-E-F illustrates the hysteresis effect in the lower output region when the circuit first becomes conductive.

Figure 5:
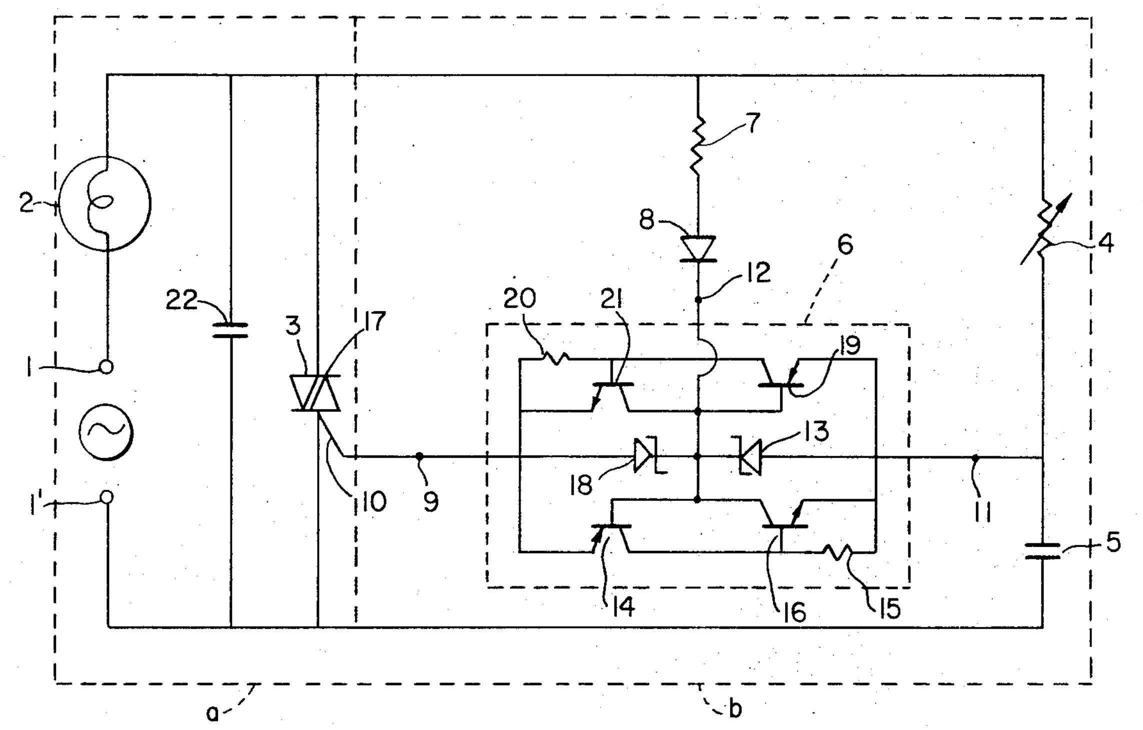
FIG. 5 is a circuit diagram of one embodiment of the phase control type dimming system of the present invention.

Now, the first embodiment of the present invention will be described with reference to FIG. 5. The reference character *a* designates a main electric current control circuit consisting of A.C. power source terminals 1 and 1', load 2 and TRIAC 3. The reference character *b* represents a gate trigger circuit for TRIAC 3, which circuit includes variable phase control resistor 4, condenser 5, SBS 6 (which is shown as an equivalent circuit in FIG. 5), resistor 7 and diode 8, said circuits *a* and *b* forming a dimming circuit. One anode terminal 9 of SBS 6 is connected to gate 10 of TRIAC 3, and the other anode terminal thereof 11 is connected to a point between condenser 5 and variable resistor 4, said resistor 4 and condenser 5 being connected in series relation to power source terminals 1 and 1' and load 2. A compensating circuit includes a resistor 7 and a diode 8 connected in series relation between load 2 and gate terminal 12 of SBS 6. In this respect, the direction of diode 8 should be that of the electric current flowing through SBS 6. Shown at 22 is a filter condenser for use in preventing noise.

More specifically, SBS 6 is designed in such a manner that the normal and reverse characteristics are as shown in FIG. 2. It provides a characteristic capable of maintaining the short-circuited condition until the impressed voltage becomes zero; its set voltage Vs is set to 6 through 10 volts which is much lower than the voltage at the power source; and it may operate in a manner similar to the case where the set voltage Vs is exceeded by impressing a voltage to the gate 12 even in the case of a voltage short of the set voltage Vs.

The operation of the embodiment in FIG. 5 will now be described. When A.C. current is impressed to power source terminals 1 and 1' and the voltage Vc to be applied for charging condenser 5 via variable resistor 4 exceeds the set voltage Vs for SBS 6, SBS 6 will be brought into its conductive or short-circuited condition, thereby rendering TRIAC 3 conductive. Assuming that before the voltage Vc at condenser 5 exceeds set voltage Vs, the cycle at the power source terminals 1, 1' has been reversed, i.e., the power source terminal 1 side has become negative and the terminal 1' side positive, and further assuming that when the next half cycle (i.e., positive at terminal 1 and negative at terminal 1') has been attained, while the voltage Vc applied for charging condenser 5 is still negative at the power source terminal 11 and before it reaches the set voltage Vs of SBS 6, then electric current will flow in turn via power source terminal 1, load 2, resistor 7, diode 8, and Zener diode 13, thereby discharging the electrical charge from condenser 5 and, at the same time, the current flow through diode 13 will apply bias voltage to the base of PNP type transistor 14 with the result that a collector current will flow through transistor 14 and a voltage drop will be provided across the opposite ends of resistor 15. Accordingly, the transistor 16 will be turned 'ON' and SBS 6 will be brought into its conductive, i.e., short-circuited, condition, thereby instantaneously discharging the electrical charge accumulated on condenser 5 therefrom via gate 10 and the cathode of TRIAC 3, thus bringing about resetting as is shown at B in FIG. 8. At this time, however, the gate current flowing to TRIAC 3 and the voltage impressed between the anode and cathode thereof is not high enough to bring TRIAC 3 into short-circuited condition, so that an incandescent lamp acting as a load will not be lit. Assuming that the power source terminal 1 is positive and the power source terminal 1' is negative, then the terminal 11 has positive potential. When the set voltage Vs for SBS 6 is exceeded, electric current will flow from point 11 through Zener diode 13 in its normal direction. This provides bias voltage to the base of PNP transistor 19, thereby causing transistor 19 to be 'ON', with the result that more electric current flows to the base of transistor 21. At this time, the electric current amplified by means of transistor 21 again flows to the base of transistor 19, so that positive feedback is applied to transistors 19 and 21, thereby short-circuiting said transistors instantaneously so as to bring the same into a saturated condition. As a result, the terminal voltage being applied between terminals 11 and 9 of SBS 6 will immediately drop from the switching voltage to the normal voltage (see FIG. 2), thereby bringing SBS into conductive or short-circuited condition. When the power source terminal 1 becomes negative and the power source terminal 1' becomes positive at the next half cycle, then Zener current will flow through the Zener diode 13, thereby turning 'ON' transistors 14 and 16 and thence bringing SBS 6 into conductive condition.

In this manner, when SBS 6 becomes conductive and hence in a short-circuited condition, then the electrical charge accumulated in condenser 5 via variable resistor 4 will be discharged, and then pulse current having delayed phase will flow through the gate of TRIAC 3, thereby short-circuiting said TRIAC to form a closed circuit consisting of power source terminal 1, load 2, TRIAC 3, and power source terminal 1', with the result that the incandescent lamp will be lit.

The aforementioned circuit which incorporates resistor 7 and diode 8 can provide a continuous and smooth dimming action varying from the rated lighting to light-out condition, by controlling the conduction time for each half a cycle of the TRIAC by varying the time required to reach the set voltage Vs of SBS 6, while the control pulse current having delayed phase with respect to the voltage at the power source is charged in condenser 5 by means of resistor 4. Therefore, this dimming circuit is well suited for controlling a load of a resistance nature and provides a dimming device which is compact in structure, easy to assemble and economical, said device additionally including one diode and one small resistor for this end.

Figure 6:
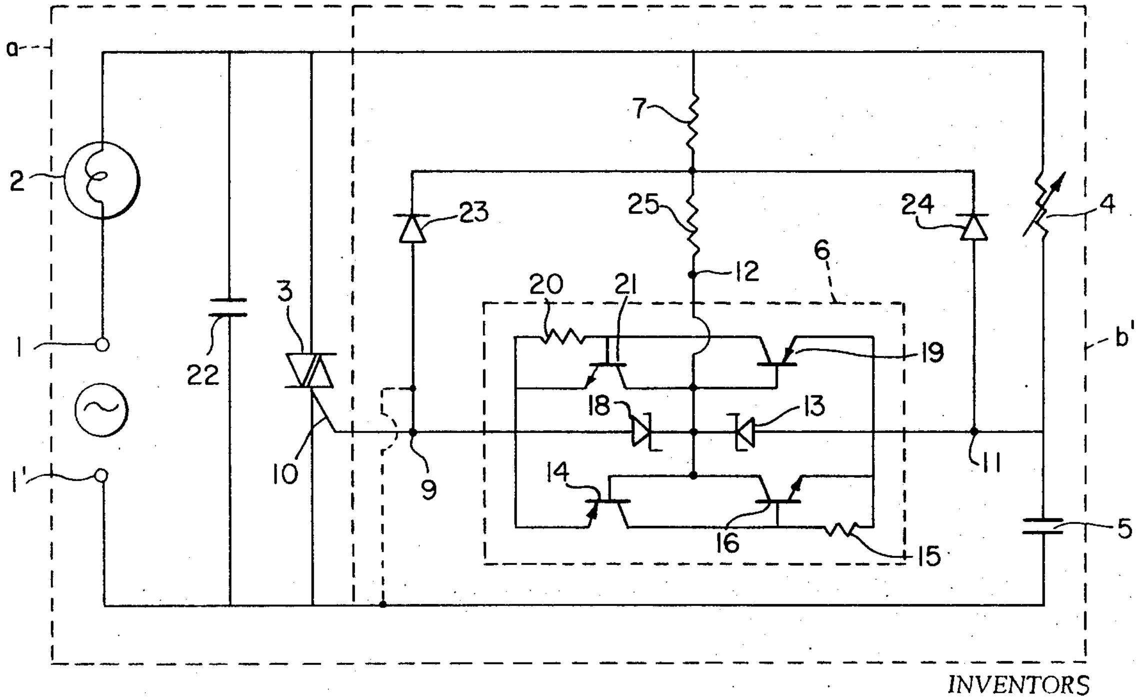
FIG. 6 is a similar circuit diagram of a second embodiment of the invention.

Referring now to the second embodiment as is shown in FIG. 6, an attempt is made therein to further improve on the elimination of the hysteresis effect. The second embodiment incorporates for this purpose two diodes and two small size resistors. A gate trigger circuit *b'* for TRIAC 3 is provided, in which one anode terminal 9 of SBS 6 is connected to the gate 10 of TRIAC 3. The other anode terminal 11 is connected to a point between condenser 5 and variable resistor 4, which in turn is connected to power source terminals 1 and 1' and load 2. Resistors 7 and 25 connected in series relation with each other are connected between load 2 and the gate terminal 12 of SBS 6. An intermediate point between resistors 7 and 25 is connected to one end of diodes 23 and 24; and the other ends of the diodes are connected to one anode terminal 9 of SBS 6 and the other anode terminal 11 thereof, respectively. Alternatively, the other end of the diode 23 may be directly connected to the power source terminal 1', as shown in dotted line in FIG. 6.

Figure 8:
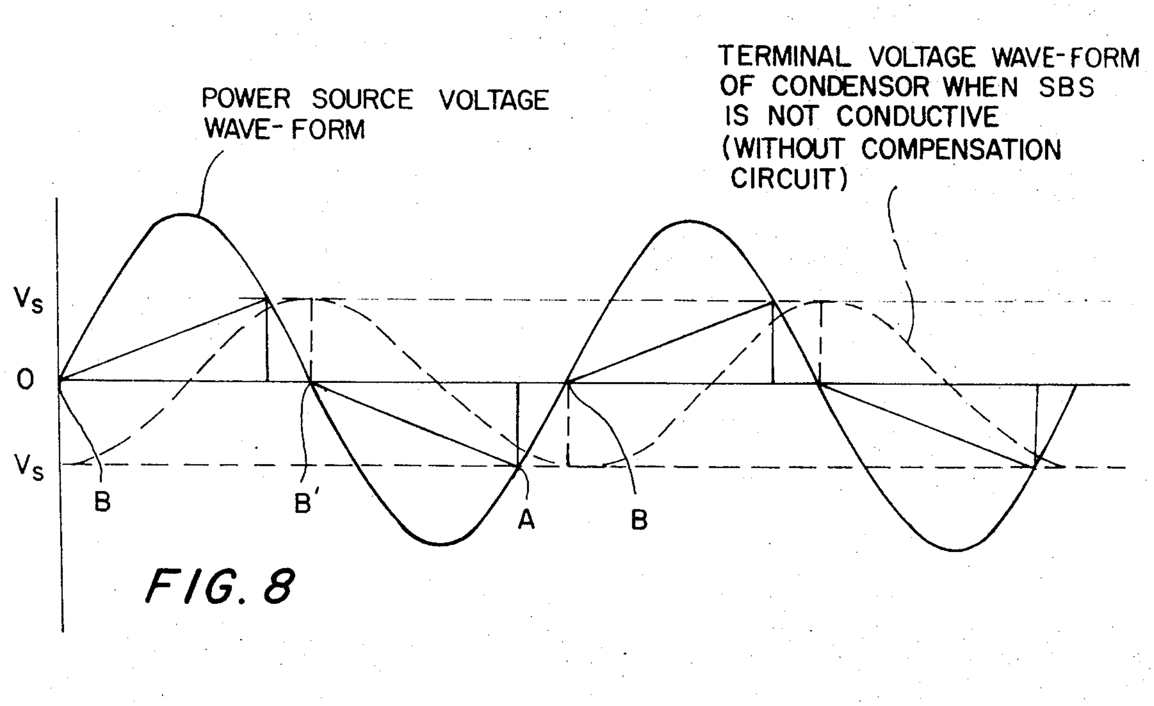
FIG. 8 is a diagram illustrating the reset operation of the circuits of the invention.

Now, referring to the operation of the second embodiment, when A.C. current is impressed to power source terminals 1, 1' and the voltage Vc to be applied for charging condenser 5 via variable resistor 4 exceeds the set voltage, SBS 6 will be conductive or short-circuited. Assuming that, before the voltage Vc at condenser 5 exceeds set voltage Vs, the cycle has been reversed, i.e., the terminal side 1 has become negative and the terminal side 1' positive, and further assuming that, before the voltage Vc reaches the set voltage Vs at SBS 6 while the terminal side 11 is negative, the terminal side 1 has become positive and terminal side 1' has become negative, i.e., as in the initial cycle, then positive electric current will flow in order through power source terminal 1, load 2, resistor 7, resistor 25, and Zener diode 13 so as to discharge the electrical charge from condenser 5. At the same time, bias voltage will be applied to the base of PNP transistor 14 because of the current flowing through the diode 13, and thereby an amplified collector current will flow to transistor 16. As a result, a positive feedback will eventually be applied to transistors 14 and 16, thereby bringing the same to a saturated condition; and the voltage applied between terminals 9 and 11 of SBS 6 will lead to a rapid drop of switching voltage Vs down to the normal voltage Vf, thereby bringing SBS 6 into its conductive, i.e., short-circuited, condition, so that the electrical charge accumulated on condensor 5 will instantaneously be discharged and reset at point B, as shown in FIG. 8. Alternatively, assuming that before the voltage Vc at condenser 5 exceeds the set voltage Vs for SBS 6, said power source voltage has been reversed, i.e., power source terminal 1 has become positive and power source terminal 1' negative and further assuming that power source terminal 1 side has become negative and power source terminal 1' side has become positive before the voltage applied for charging to condenser 5 reaches the set voltage for SBS 6, then positive electric current will flow in order through power source terminal 1', condenser 5, diode 24, resistor 7, load 2, and power source terminal 1, so as to discharge the electrical charge from condenser 5. On the other hand, however, positive current will flow in order through power source terminal 1', the cathode of TRIAC 3, gate 10, diode 23, resistor 7, load 2, and power source terminal 1, whereby it will be reset at a point B' as shown in FIG. 8, thus eliminating the hysteresis effect. When the voltage being accumulated in condenser 5 via variable resistor 4 exceeds the set voltage Vs, SBS 6 will be brought to a conductive condition. After SBS 6 has become conductive, the operation will be carried out as described above as to the first embodiment.

As is apparent from the foregoing, the first embodiment is contemplated to eliminate the hysteresis effect by resetting the charge on condenser 5 only for one-half cycle, while the second embodiment is intended to reset both half waves for control, so that a smooth control can be accomplished over the range of 5 to 99 percent of A.C. input voltage not only for resistor but also for inductor loads, thereby providing a dimming device which is economical and compact in construction.

Figure 7:
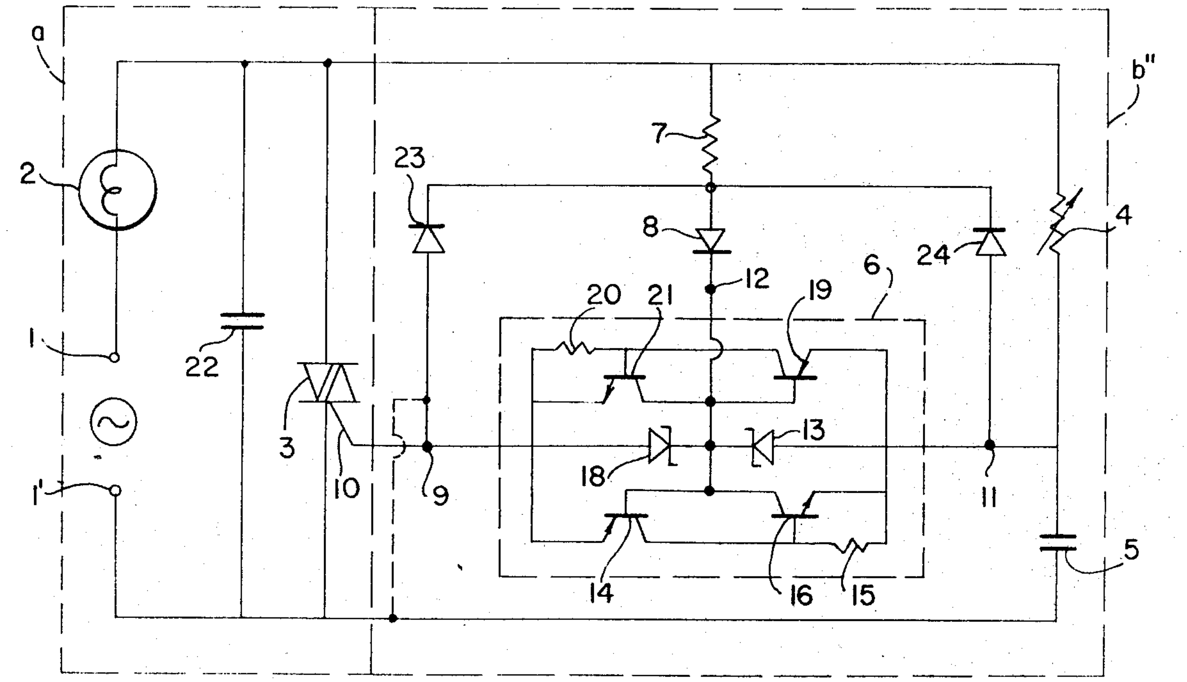
FIG. 7 is a similar circuit diagram of a third embodiment of the invention.

Referring now to the third embodiment as is shown in FIG. 7, this embodiment provides control over a wide range of voltages and permits dimming for resistor as well as for inductor loads and employs an integrated circuit in which diodes are incorporated in the same semiconductor as the SBS. The aforementioned basic circuit is provided with a combination of three diodes having a low withstand voltage and one small size resistor. More specifically, in the gate trigger circuit *b''* for TRIAC 3, one anode terminal 9 of SBS 6 is connected to the gate 10 of TRIAC 3. The other terminal 11 is connected to an intermediate point between condenser 5 and variable resistor 4, the latter of which is connected in series relation to power source terminals 1, 1' and load 2. Resistor 7 is connected in series relation to diode 8 with one end of diode 8 being connected to gate terminal 12 of SBS 6; and the other end of resistor 7 is connected via load 2 to the power source terminal 1, while the polarity of diode 8 is maintained in a direction of electric current flowing through the gate 12 of SBS 6. In addition to this, it is contemplated that diodes 23 and 24 are connected to an intermediate point between resistor 7 and diode 8, while the other ends thereof are connected to anode terminals 9 and 11 of SBS 6, respectively, diodes 23 and 24 having a polarity opposite to that of diode 8, i.e., so as to cause current to flow in the path of resistor 7, load 2 and power source terminal 1. Alternatively, the other end of diode 23 may be connected to the power source terminal 1' as shown in dotted line in FIG. 7.

Referring now to the operation of the third embodiment, when A.C. voltage is impressed to terminals 1 and 1' and the voltage Vc being applied for charging condenser 5 via variable resistor 4 exceeds the set voltage Vs for SBS 6, SBS 6 will be brought to its conductive, i.e., short-circuited, condition, thereby rendering TRIAC 3 conductive. Assuming that before the voltage Vc at condenser 5 exceeds the set voltage Vs, the power source voltage has been reversed, i.e., the terminal 1 side has become negative and power source terminal 1' side has become positive, then positive current will flow in order through power source terminal 1, load 2, resistor 7, diode 8, Zener diode 13, condenser 5, and power source terminal 1', thereby bringing SBS 6 into conductive condition and then instantaneously discharging the electrical charge accumulated in condenser 5 therefrom so as to reset the same as at point B of FIG. 8. Upon the completion of the resetting action as is shown at point B, the current will flow, in addition to the aforementioned current flow path, in the path comprising in order source terminal 1, load 2, resistor 7, diode 8, Zener diode 18, gate 10 of TRIAC 3, and power source terminal 1', so that condenser 5 may not be charged with excessive electrical charge. On the other hand, assuming that before the voltage Vc at condenser 5 exceeds the set voltage, the cycle of the power source voltage has been reversed, i.e., power source terminal side 1 has become positive and power source terminal side 1' has become negative, and further assuming that before the voltage Vc being charged in condenser 5 reaches the set voltage for SBS 6, power source terminal side 1 has become negative and power source terminal side 1' has become positive, then positive current will flow in the path of power source terminal 1', condenser 5, diode 24, resistor 7, load 2, and power source terminal 1, thereby discharging the electrical charge accumulated on condenser 5 therefrom. At the same time positive current will flow in the path of power source terminal 1', the gate 10 of TRIAC 3, diode 23, resistor 7, load 2, and power source terminal 1, thereby bringing about the electrical charge at point B' as shown in FIG. 8 without charging condenser 5 excessively. Thus, after SBS 6 has become conductive, i.e., short-circuited, the operation will be carried out in a manner similar to the operation of the first and second embodiments.

As is apparent from the foregoing, the third embodiment provides the compensating circuit with a combination of diodes having a lower negative withstand voltage and small size resistors, said embodiment providing advantages in that (i) it provides control over the conduction time for both half cycles of power source voltage waves, (ii) it provides smooth control over the input voltage throughout the range of 5 to 99 percent thereof, (iii) it is suited to applications using not only resistance loads but also inductive type loads, (iv) since the negative withstand voltage of the diodes may only be above the set voltage for the SBS, and this provides extremely low voltage and decreased electric current, it provides the minimum electric power loss, (v) it is easily provided as a monolithic integrated circuit in which the three diodes are incorporated within the SBS, and (vi) it can be provided economically and as a device of compact size.

What is claimed is:

1. A phase control type dimming system, comprising a bi-directional three terminal thyristor adapted to be connected in series with an A. C. load circuit, a variable resistor and condenser in series arranged in parallel relation with said thyristor, a silicon bilateral switch interposed between the gate of said bi-directional three terminal thyristor and an intermediate point between said variable resistor and condenser, and compensating circuit means connected to the gate terminal of said silicon bi-lateral switch for eliminating the hysteresis effect and for extending the control range of the system, said compensating circuit means comprising a resistor and a diode connected in series between one side of the thyristor and said gate terminal of said silicon bi-lateral switch, said diode being conductive in the direction towards said gate terminal.

2. A phase control dimming system as recited in claim 1, wherein said compensating circuit means further comprises two additional diodes connected from the intermediate point between said resistor and said first diode and to respective anode terminals of said switch, the direction of conductivity of said additional diodes being the opposite of the direction of conductivity of said first diode as viewed from said intermediate point.

3. A phase control type dimming system as recited in claim 2, wherein said first diode, said two additional diodes, and said silicon bi-lateral switch are arranged to form an integrated circuit as one semiconductor.

4. A phase control type dimming system, comprising a bi-directional three terminal thyristor adapted to be connected in series with an A.C. load circuit, a variable resistor and condenser in series arranged in parallel relation with said thyristor, a silicon bi-lateral switch interposed between the gate of said bi-directional three terminal thyristor and an intermediate point between said variable resistor and condenser, and compensating circuit means connected to the gate terminal of said silicon bi-lateral switch for eliminating the hysteresis effect and for extending the control range of the system, said compensating circuit means comprising two resistors connected in series between one side of said thyristor and said gate terminal of said silicon bi-lateral switch and two diodes connected from the intermediate point between said two resistors and to respective anode terminals of said switch.

* * * * *